United States Patent
Khaselev et al.

(10) Patent No.: US 6,808,614 B2
(45) Date of Patent: Oct. 26, 2004

(54) ELECTROPLATING SOLUTION FOR HIGH SPEED PLATING OF TIN-COPPER SOLDER

(75) Inventors: Oscar Khaselev, Monmouth Junction, NJ (US); Igor S. Zavarine, Brooklyn, NY (US); Yun Zhang, Warren, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/050,013

(22) Filed: Jan. 17, 2002

(65) Prior Publication Data

US 2003/0131753 A1 Jul. 17, 2003

(51) Int. Cl.$^7$ .............................. C25D 3/60; C25D 3/58; C23C 18/00
(52) U.S. Cl. ...................... 205/253; 205/241; 106/1.23; 106/1.26
(58) Field of Search ................... 205/241, 252, 205/253; 106/1.23, 1.26

(56) References Cited

U.S. PATENT DOCUMENTS 4,981,564 A * 1/1991 Kroll et al. ................. 204/44.4
2002/0104763 A1 * 8/2002 Yanada et al. .............. 205/241

* cited by examiner

*Primary Examiner*—Edna Wong

(57) ABSTRACT

In accordance with the present invention, an electroplating solution is provided for electroplating satin bright tin-copper alloy solder coatings at high speed. The preferred solution comprises sulfonic acid, tin sulfonate, copper sulfonate, non-ionic surfactant, satin brightener and an antioxidant catechol. The preferred surfactant is polyoxyethylene-block-polyoxypropylene. The preferred satin brightener is formed by the oxidation of an aqueous solution of 1-phenyl-3-parazolidinone. The preferred sulfonic acid is methanesulfonic acid.

8 Claims, 1 Drawing Sheet

ELECTROPLATING SOLUTION FOR HIGH SPEED PLATING OF TIN-COPPER SOLDER

FIELD OF THE INVENTION

This invention relates to an aqueous electroplating solution for high speed electroplating satin bright tin-copper solder coatings.

BACKGROUND OF THE INVENTION

Electroplated solder coatings are used extensively in the electronics industry in the manufacture of printed wiring boards (PWBs), electrical contacts and connectors, semiconductor packaging, electrical conduits and other related parts. These plated solder coatings must be pore free, corrosion resistant, display long term solderability and be free from solderability failures such as nonwetting and dewetting.

Until recently, lead and lead-tin alloys have been the most widely used solder coatings. But because of the toxicity of lead there has been a world-wide drive to replace lead solders in electronic parts. As a consequence there is an ongoing effort to find a replacement for tin-lead solder that can be "dropped" into current applications. Electrodeposited tin-copper alloys are possible alternatives to commonly used tin-lead solder coatings.

Electroplating chemistries for tin-copper alloy plating have been known for many years. However, they were mainly used for electroplating of bronze, which is a tin-copper alloy with copper content normally between 20 and 50%. Such chemistries can not be utilized for solder plating with low copper content as required by the electronic industry. With the recent impetus to eliminate lead, new chemistries were developed for tin-copper solder plating. See, for example, I. Yanada et al., Eur. Pat. 1001054. These plating solutions, however, suffer from three major deficiencies: 1) they give a matte appearance, 2) they operate at relatively low current densities (up to 50 ASF) and 3) they have problems with copper immersion deposition. In order to overcome the matte appearance of the electrodeposited tin-copper alloy, a bright process was developed. However, the bright deposits often fail solderability tests.

Accordingly there is a need for a immersion-free electroplating solution that can produce high speed, satin bright plating of tin-copper alloy that will meet the solderability requirements for PWB and electronics packaging applications.

SUMMARY OF THE INVENTION

In accordance with the present invention, an electroplating solution is provided for electroplating satin bright tin-copper alloy solder coatings at high speed. The preferred solution comprises sulfonic acid, tin sulfonate, copper sulfonate, non-ionic surfactant, satin brightener and an antioxidant catechol. The preferred surfactant is polyoxyethylene-block-polyoxypropylene. The preferred satin brightener is formed by the oxidation of an aqueous solution of 1-phenyl-3-parazolidinone. The preferred sulfonic acid is methanesulfonic acid.

BRIEF DESCRIPTION OF THE DRAWINGS

The advantages, nature and various additional features of the invention will appear more fully upon consideration of the illustrative embodiments now to be described in detail in connection with the accompanying drawing. In the drawing.

DETAILED DESCRIPTION

Figure 1:
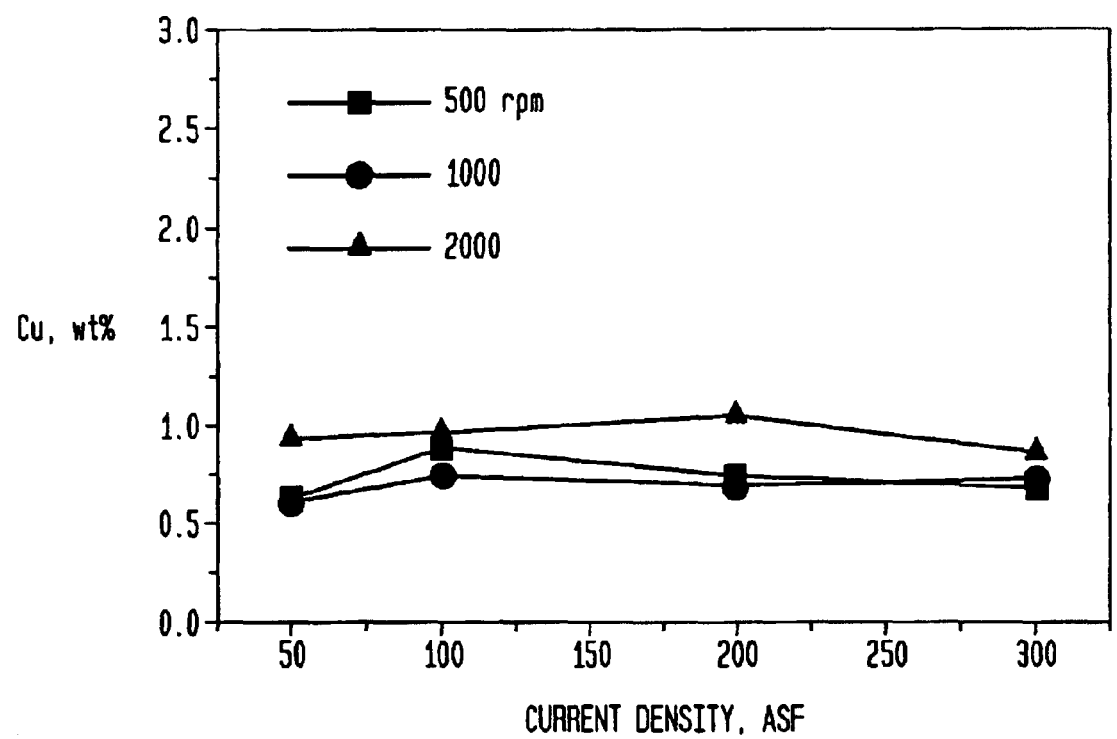
FIG. 1 is a graphical illustration showing the copper content of a tin-copper coating as a function of applied current density and rotation speed of a cylindrical plating electrode.

To become drop-in replacements for tin-lead solder in PWB and semiconductor applications, tin-copper alloys should meet certain requirements. Good solderability is the most important one. To provide good solderability, the copper content in the alloy should be between 0.5 and 0.9%, with a target content of 0.7%, (an eutectic alloy with the melting point minimum at 227° C.). Bright alloys typically have high carbon content, which leads to soldering problems. Therefore matte or satin bright solder finishes are usually utilized when solderability is crucial. Satin bright finish provides distinct advantages when compared to matte finish. Specifically, it provides a smoother surface, greater cosmetic (visual) appeal and better solderability.

Applicants have formulated an electroplating solution that produces a satin bright tin-copper alloy coating having low organic (carbon) content at current densities as high as 200 ASF. The electroplating solution comprises sulfonic acid, a soluble tin compound, a soluble copper compound, a non-ionic surfactant, a satin brightener and an antioxidant. The coatings have excellent reflowability and solderability.

The preferred brightening additive, known as Satin Brightener P, is formed by the oxidation of aqueous 1-phenyl-3-pyrazolidinone. Alternative brighteners include aromatic and tertiary amines.

The non-ionic surfactant improves the dispersibility and also ensures that the plated solder coatings adhere well to the underlying substrate. The preferred surfactant is polyoxyethlene-block-polyoxypropylene with molecular weight between 2000 and 10,000. Alternative non-ionic surfactants include end-labeled polyethylene glycol.

The sulfonic acid electrolyte used in the solution should be water soluble or soluble in the solution. The preferred embodiment comprises methanesulfonic acid. Alternative sulfonic acids include the lower alkane or alkanol sulfonic acids containing 1–5 carbon atoms.

The preferred antioxidant is a catechol.

The tin and copper compounds typically used in the solution are those which are soluble in the sulfonic acid and form a sulfonic acid salt. Tin, for example, can be added as tin methane sulfonate and copper can be added as copper methanesulfonate. Alternatively the metals can be added in other forms so long as sufficient sulfonate ions are present that the metals predominate as sulfonates in the bath.

The invention may now be understood more clearly by consideration of the following specific example.

EXAMPLE

A solution for electroplating a tin-copper alloy is prepared by adding about 150 g/l of tin methanesulfonate and about 4 g/l of copper methanesulfonate to about 150 ml of methanesulfonic acid. To this solution is added about 0.15 g/l of Satin Brightener P, and about 6 g/l of non-ionic surfactant.

After the solution is prepared it can then be used in a high speed electroplating cells for electroplating tin-copper alloy onto a metal substrate (the cathode) by placing the metal substrate in the solution equipped with a soluble tin anode. The electroplating solution is maintained at a temperature in the range 20–40 C. The current densities used for electroplating are typically between 50 and 200 ASF.

The substrate is maintained in the solution under the above conditions for a period of time sufficient to plate the substrate with a tin-copper alloy coating of a desired thickness, typically in the range 3–6 micrometers.

The bath made up using above components is capable of plating tin-copper alloy with satin bright finish at current densities between 50 and 200 ASF. The alloy composition was stable in a wide operating window and was not sensitive to the agitation and the current densities. See FIG. 1. The excellent solderability of the tin-copper deposit was demonstrated in numerous experiments, such as "dip-and-look" solderability tests and reflow. Another advantage of the proposed bath is the negligible immersion coating of pure copper on the tin anode.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. An electroplating solution for plating tin-copper alloy solder coatings comprising:

a sulfonic acid electrolyte;

a tin compound soluble in the sulfonic acid to form a tin sulfonate;

a copper compound soluble in the sulfonic acid to form a copper sulfonate;

a non-ionic surfactant;

a satin brightener comprising a tertiary amine, or oxidized 1-phenyl-3-pyrazolidinone; and an antioxidant.

2. The electroplating solution of claim 1 wherein the sulfonic acid electrolyte comprises an alkane or alkanol sulfonic acid containing 1–5 carbon atoms.

3. The electroplating solution of claim 1 wherein the sulfonic acid electrolyte comprises methanesulfonic acid.

4. The electroplating solution of claim 1 wherein the tin compound comprises tin methanesulfonate.

5. The electroplating solution of claim 1 wherein the copper compound comprises copper methanesulfonate.

6. The electroplating solution of claim 1 wherein the non-ionic surfactant comprises a polyethylene glycol.

7. The electroplating solution of claim 1 wherein the non-ionic surfactant comprises polyoxyethylene-block-polyoxypropylene with molecular weight between 2000 and 10,000.

8. The electroplating solution of claim 1 wherein the antioxidant comprises a catechol.

* * * * *